United States Patent [19]

Brass

[11] Patent Number: 5,789,911
[45] Date of Patent: Aug. 4, 1998

[54] POLARITY TESTING PROBE AND LED CARTRIDGE ASSEMBLY

[75] Inventor: Jack Brass, North York, Canada

[73] Assignee: Brasscorp. Ltd., Canada

[21] Appl. No.: 796,158

[22] Filed: Feb. 6, 1997

[51] Int. Cl.[6] .................... G01R 31/02; G01R 19/14
[52] U.S. Cl. ................. 324/72.5; 324/133; 324/556
[58] Field of Search ..................... 324/72.5, 133, 324/149, 509, 511, 555, 556

[56] References Cited

U.S. PATENT DOCUMENTS

| | | | |
|---|---|---|---|
| 2,186,212 | 1/1940 | Scoggin | 324/556 |
| 2,917,705 | 12/1959 | Clough | 324/72.5 |
| 3,820,017 | 6/1974 | Reichenbach | 324/72.5 |
| 4,005,362 | 1/1977 | Fortino | 324/72.5 |
| 4,027,236 | 5/1977 | Stewart | 324/556 |
| 4,028,621 | 6/1977 | Bloxam | 324/556 |
| 4,366,434 | 12/1982 | Ellis | 324/556 |
| 4,540,940 | 9/1985 | Nolan | 324/133 |
| 4,584,526 | 4/1986 | Lobastov | 324/133 |
| 4,740,745 | 4/1988 | Sainz | 324/133 |
| 4,825,150 | 4/1989 | Sirasud | 324/133 |
| 4,999,574 | 3/1991 | Stephens | 324/133 |
| 5,270,638 | 12/1993 | Mellott | 324/133 |
| 5,303,124 | 4/1994 | Wrobel | 362/20 |
| 5,367,250 | 11/1994 | Whisenand | 324/133 |
| 5,572,143 | 11/1996 | Myers et al. | 324/555 |

OTHER PUBLICATIONS

Brochure entitled "Circuit Tester" CT8002/CT8007, Wireless/Computer-Safe Circuit Testers undated.

*Primary Examiner*—Diep N. Do
*Attorney, Agent, or Firm*—Fitzpatrick, Cella, Harper & Scinto

[57] ABSTRACT

A polarity testing probe has a prod, a handle, an end cap, a wire, a cavity, first and second testing contacts, and a LED cartridge assembly. The prod extends from the handle. The end cap encloses the cavity within the handle. The handle is transparent through to the cavity. The wire extends from the end cap outside of the handle to a clamp. The first and second testing contacts are in the cavity and oppose one another. The first test contact is electrically connected to the prod. The second test contact is electrically connected to the wire. The assembly fits into the cavity with first and second assembly contacts to contact the first and second test contacts, respectively. The assembly has one LED connected to conduct and illuminate in one direction between the prod and the wire. The assembly has a second LED connected to conduct and illuminate in the opposite direction between the prod and the wire. The assembly has a transparent holder with wells to receive the LEDs. The assembly has a spring contact at one end and a button contact at the other. The assembly has a protection resistor. The assembly can be used to easily convert existing non-polarity testing probes to polarity testing probes. The assembly can be used with packages that contain two LEDs as an integrated unit for placement in a single well of the holder.

17 Claims, 5 Drawing Sheets

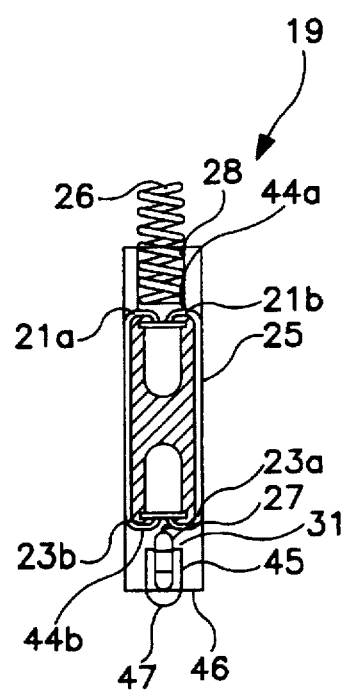
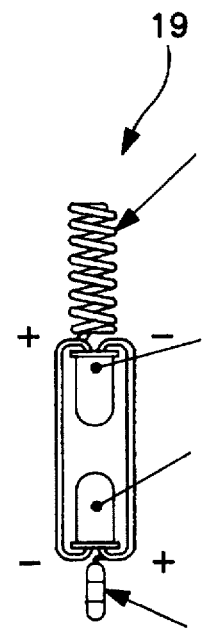
FIG. 2          FIG. 3
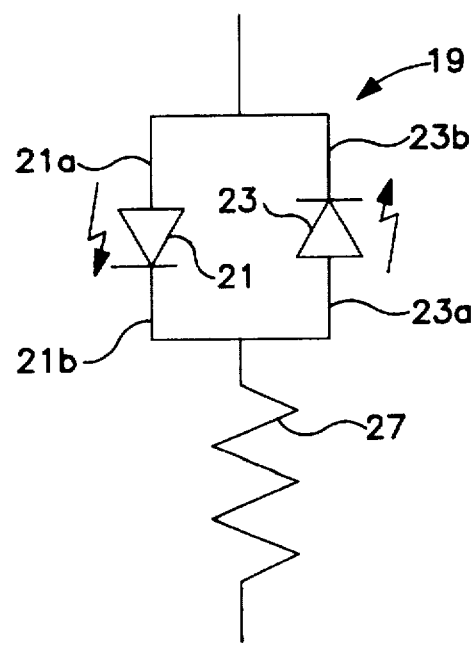
FIG. 4

5,789,911

POLARITY TESTING PROBE AND LED CARTRIDGE ASSEMBLY

FIELD OF THE INVENTION

The invention relates to electrical testing probes and lights for electrical testing probes.

BACKGROUND OF THE INVENTION

Electrical testing probes are used to determine whether or not a particular spot on a piece of equipment or wire is at a voltage different from a given voltage. This is done by attaching one end of the probe to a source of the given voltage and touching the other end of the probe to the spot to be tested, or using a pointed end of the probe to pierce a wire to be tested. A small incandescent light bulb is electrically connected between the two ends of the probe. If the voltage difference across the light bulb is sufficient then current flows through the bulb and the bulb lights. There are large numbers of these types of probes in existence; mainly for use in automotive testing. Obviously they are very limited in the testing functions that they can perform.

Many improvements have been made to these simple probes. For example, Sainz in U.S. Pat. No. 4,740,745 entitled Polarity and Continuity Tester for Primary and Secondary Automotive Circuits issued Apr. 26, 1988 describes a probe with a dual color LED extending from one end of the probe. A voltage drop across the probe in one direction causes the LED to illuminate red and a voltage drop in the other direction across the probe causes the LED to illuminate green. This allows the user to check not only the existence of a voltage difference across the probe; but also, the polarity of the voltage difference.

Mellott in U.S. Pat. No. 5,270,638 entitled Probe Device for Testing Polarity of a Power Supply and Polarity of Test Element with Respect to the Power Supply issued Dec. 14, 1993 further describes a probe having a printed circuit board with two dual color LEDs inside of a transparent handle. The printed circuit board fits into a custom cavity and is connected through electrical clips to wires extending from the end of the cavity.

It is an object of the present invention to provide an alternative probe and LED configuration.

SUMMARY OF THE INVENTION

In a first aspect the invention provides a testing probe having a prod, a handle, an end cap, a wire, a cavity, first and second testing contacts, and a LED cartridge assembly. The prod extends from the handle. The end cap encloses the cavity within the handle. At least a portion of the handle is translucent through to the cavity. The wire extends from the end cap outside of the handle. The first and second testing contacts are in the cavity and oppose one another. The first test contact is electrically connected to the prod. The second test contact is electrically connected to the wire.

The LED cartridge assembly has a first LED with a first anode and a first cathode and a second LED with a second anode and a second cathode. The first anode is connected to the second cathode and the first cathode is connected to the second anode. The first anode is also connected to a first assembly contact and the second anode is also connected to a second assembly contact. The assembly fits within the cavity with the first assembly contact in contact with the first testing contact and the second assembly contact in contact with the second testing contact.

In a second aspect the invention provides an LED cartridge assembly having a first LED with a first anode and a first cathode and a second LED with a second anode and a second cathode. Each LED fits within a well in a holder. The first anode and second cathode are connected to a first assembly contact on a first end of the holder and the first cathode and second anode are connected to a second assembly contact on a second end of the holder opposing the first end. A portion of the holder is translucent to allow transmission of light from the first and second LEDs through the holder.

Each assembly may have a spring for the first assembly contact, and a button contact for the second assembly contact. The holder may have first and second wells with the first LED in the first well and the second LED in the second well.

The holder may be generally cylindrical with a longitudinal axis and opposing first and second holder ends along the longitudinal axis. In this configuration, the first well extends from the first holder end into the holder along the axis, the second well extends from the second holder end into the holder along the axis.

The respective anodes and cathode may be connected to one another via leads extending from the first and second LEDs around either side of the holder.

A first slot may be cut through the first well and the axis from the first end toward the first LED. A second slot may be cut through the second well and the axis from the second end toward the second LED. In this configuration, the leads pass through the first and second slots and around the sides of the holder.

The holder may have first and second opposing grooves running longitudinally along either side of the holder with the leads fitting into the grooves.

The second assembly contact may be a button contact enclosing the second well at the second end of the holder. The first assembly contact may be a spring extending along the axis in the first well.

A protection resistor may be connected between the second anode and the second assembly contact. Non-conductive electrical insulation may be placed between the spring and the first cathode. Non-conductive electrical insulation may be placed between the resistor and the second cathode.

A conductive eyelet may be pressure fit into the second well at the second end for receiving the second assembly contact. The first LED may have a first colour and the second LED may have a second colour visually distinguishable from the first colour.

The first and second LEDs may be in a single LED package in a single well.

In a third aspect the invention provides an LED cartridge assembly with first and second LEDs and a holder. Each LED is connected between a first assembly contact and a second assembly contact. The first LED conducts when a voltage difference between the first and second assembly contacts has a first polarity and the second LED conducts when the voltage difference has a second opposite polarity. Each LED fits within a well in the holder. A portion of the holder is translucent to allow transmission of light from the first and second LEDs through the holder.

In a fourth aspect the invention provides an LED cartridge assembly for use in a cavity of a testing probe between first and second testing contacts. The testing probe has a prod, a handle, an end cap, and a wire. The prod extends from the handle. The end cap encloses the cavity within the handle. At least a portion of the handle is translucent through to the cavity. The wire extends from the end cap outside of the handle. The first and second testing contacts are in the cavity and oppose one another. The first test contact is electrically connected to the prod. The second test contact is electrically connected to the wire. The LED cartridge assembly has a first LED with a first anode and a first cathode and a second LED with a second anode and a second cathode. Each LED fits within a well in a holder. The first anode and second cathode are connected to a first assembly contact on a first end of the holder and the first cathode and second anode are connected to a second assembly contact on a second end of the holder opposing the first end. A portion of the holder is translucent to allow transmission of light from the first and second LEDs through the holder. The holder is dimensioned to fit within the cavity of the probe with the first and second assembly contacts in contact with, but not attached to, the first and second testing contacts.

BRIEF DESCRIPTION OF THE DRAWINGS

For a better understanding of the present invention and to show more clearly how it may be carried into effect, reference will now be made, by way of example, to the accompanying drawings which show the preferred embodiment of the present invention and in which:

FIG. 2 is a cross-section of the cartridge assembly of FIG. 1.

FIG. 3 is a cross-section of portions of the cartridge assembly of FIG. 1 showing electrical connections.

FIG. 4 is an electrical diagram of the portions shown in FIG. 3.

Referring to FIG. 1, a polarity testing probe 1 has a handle 3. The handle 3 has a generally tubular cavity 5. Extending from one end of the cavity 5 through the handle 3 is a prod 7. Enclosing another opposing end of the cavity 5 is an end cap 9.

Figure 1:
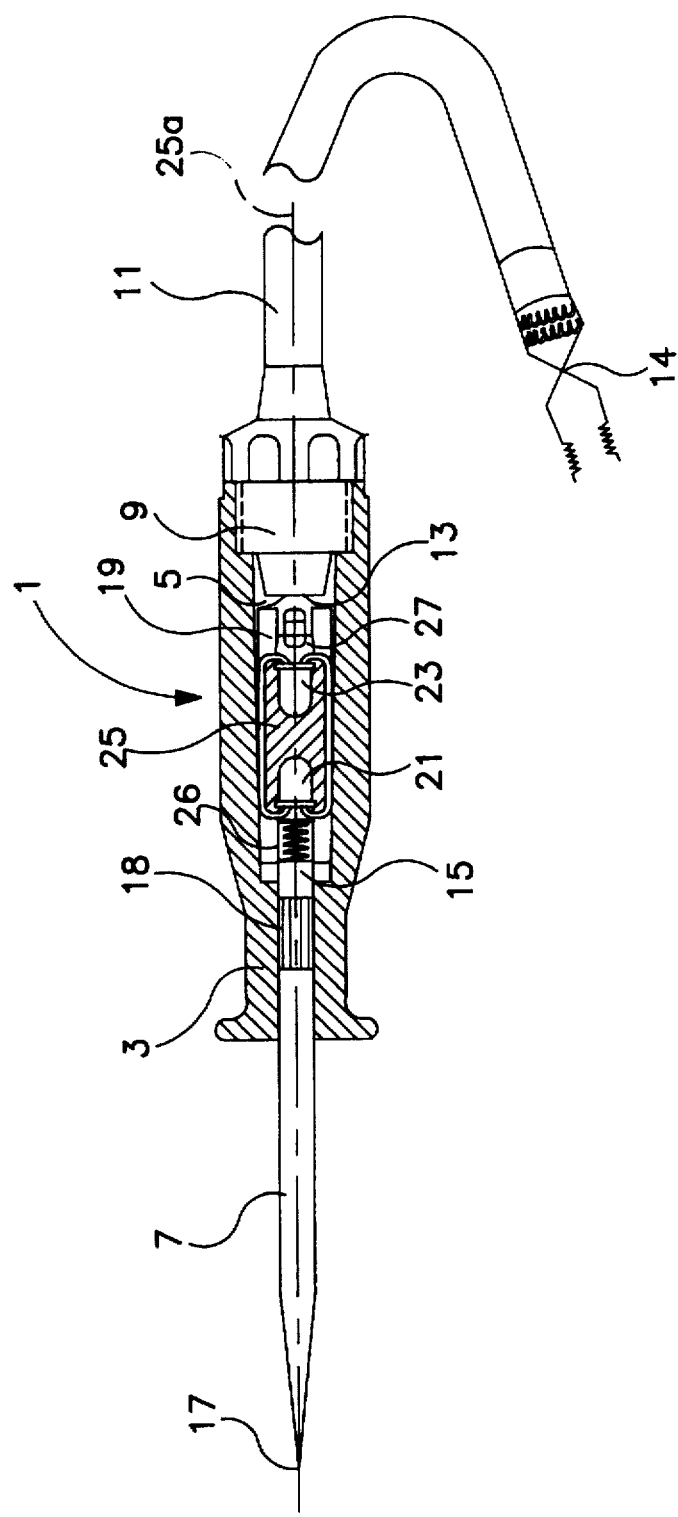
FIG. 1 is a cross-section of a probe and LED cartridge assembly according to the preferred embodiment of the present invention.

The end cap 9 may be pressure fit into the handle, as shown in FIG. 1. Alternatively, it may be screw fit or fit by some alternative releasable means as would be evident to a person skilled in the art.

A wire 11 extends from the end cap 9 outside the cavity 5. There is an end cap contact 13 on the end cap 9 within the cavity 5. The contact 13 and the wire 11 are electrically connected. On the opposing end of the wire 11 is a clamp 14 or other holding device which would be evident to a person skilled in the art.

The prod 7 has a prod contact 15 opposing the contact 13 within the cavity. At an end of the prod 7, opposite the prod contact 15, the prod 7 has a pointed tip 7. The prod 17 is conductive from the tip 17 to the contact 15. Typically the prod 7 would be formed from metal. The tip 17 can be sharp enough, and the prod 7 stiff enough, to pierce insulated electrical wire. In an alternate embodiment, the tip 17 could be in alternate shapes, such as a screw driver blade, not shown, for dual purpose use; however, in such an application, the prod 7 would not be able to pierce insulated wire for testing inside the wire.

In the preferred embodiment, the handle 3 is injected molded over the prod 7. The prod 7 has splines 18 to prevent rotation or other movement between the handle 3 and prod 7. Alternatively, the prod 7 could be set into the handle after molding using a press fit with swages or other movement resistant coupling, not shown, in place of the splines 18.

The end cap contact 13 and the prod contact 15 are opposing test contacts 13, 15 within the cavity 5. Other opposing test contacts could be used as would be evident to a person skilled in the art, such as a button and folded spring combination as is typically used in low voltage dry cell battery cavities, not shown, or simply two opposing button contacts.

Within the cavity 5 between the contacts 13, 15 is a cartridge assembly 19.

Referring to FIGS. 1 and 2, the cartridge assembly 19 has two LEDs 21, 23 held by a holder 25. The holder 25 holds the LEDs 21, 23 in place during manufacturing. The holder 25 also provides support to the LEDs 21, 23 to prevent them, or their leads, from contacting one another when the assembly 19 is placed in the cavity 5. The leads of an LED are typically made from aluminum and do not provide much support on their own. The holder 25 also has other functions as will be evident from this description to those skilled in the art.

The holder 25 and handle 3 are translucent and, preferably, colourless. The holder 25 and handle 3 must allow the transmission of light from the LED to the user of the probe in such a way that the illumination of one LED 21, 23 is distinguishable from the illumination of the other LED 23, 21, respectively. For the purposes of this description, transparent materials are considered to be a subset of translucent materials.

The holder 25 and handle 3 are also non-electrically conductive. The holder 25 is generally cylindrical and has an axis 25b, which is generally aligned with the axis 25a.

Clear polycarbonate plastic has been found to be suitable for both the handle 3 and holder 25. It is transparent and transmits the light from the LEDs 21, 23 to outside the handle 3 with limited distortion, maintaining satisfactory brilliance, particularly when combined with the latest ultra bright LEDs for LEDs 21, 23.

Alternatively, acrylic or glass could be used for the handle 3 or holder 25, depending on the cost, temperature, ultraviolet, and scratch and damage resistance properties and other properties desired for the particular application.

Where the location of the LEDs is sufficiently distinguishable by the user through the handle 3 and the holder 25, the LEDs need not be of different colour. Transparent handle 3 and holder 25 would be preferable in such an application. Even though use of a single colour of LED is possible, different colour LEDs 21, 23 are preferable for ease of use. The user need only see the colour and does not have to closely examine the probe 1 in order to determine which LED 21, 23 is illuminated.

The handle 3 and holder 25 do not have to be translucent throughout there entirety. The handle 3 and holder 25 would be sufficiently translucent if translucent windows, not shown, were provided through the handle 3 and holder 25 to the LEDs 21, 23. However, it is preferable for the holder 25 and handle 3 to be translucent for 360 degrees about the longitudinal axis 25a of the probe 1. It is also preferable for the handle 3 and holder to be entirely translucent to permit light from the LEDs to pass in all directions.

Referring to FIGS. 3 and 4, each LED has an anode 21a, 23a and a cathode 21b, 23b. The anode 21a of one LED 21 is connected to the cathode 23b of the other LED 23. The cathode 21b of LED 21 is connected to the anode 23a of LED 23. The anode 21a is also connected to a conductive spring 26 usually formed from metal. A protection resistor 27 is connected to the other anode 23a. In low voltage DC application, for example the 6, 12 and 24 volts typically found in automotive applications, a 330 ohm, 1 watt resistor 27 has been found to be adequate. Other size resistors can be used in other applications. Properly configured, the probe can be used in all types of polarity testing applications, for example computers, electronics and aviation.

Figure 5:
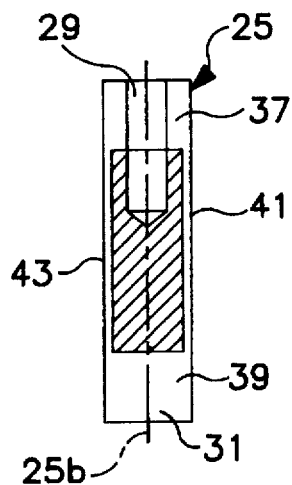
FIG. 5 is a cross-section of a holder of the cartridge assembly of FIG. 1.
Figure 6:
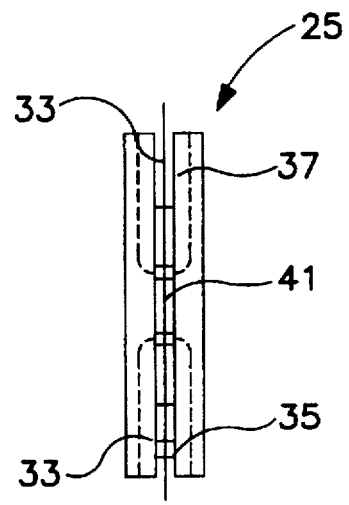
FIG. 6 is a side view of the holder of FIG. 5.

Referring to FIGS. 5 and 6, the holder 25 is generally cylindrical. It has opposing wells 29, 31 drilled into opposing ends of the holder 25. A slot 33, 35 is provided through an outer portion 37, 39 of each well 29, 31.

Figure 7:
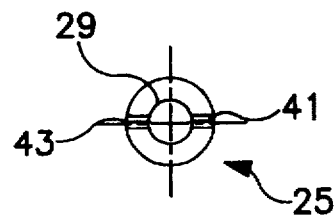
FIG. 7 is an end view of the holder of FIG. 5.

Referring to FIGS. 5, 6 and 7, grooves 41, 43 are provided on the exterior of the holder 25 between the slots 33, 35.

Referring to FIG. 2, LED 21 fits within well 29 and LED 23 fits within well 31. The wells 29, 31 may have a different profile for LEDs having different package configurations. The anode 21a is bent through slot 33 into groove 41. The cathode 23b is bent through slot 35 into groove 41. Anode 21a and cathode 23b are electrically connected together by soldering or other means known in the art. Similarly, cathode 21b and anode 23a are connected together along groove 43.

Spring 26 is soldered or connected to anode 21a another manner known in the art, so that, the spring 26 extends outwardly from the LED 21 in the well 29. Similarly, the resistor 27 is connected to the anode 23a and extends outwardly in the well 31.

Insulating washers 44a, 44b are placed between the spring 26 and cathode 21b and between the resistor 45 and cathode 23b, respectively, to prevent shorting.

A tubular eyelet 45 with a flange 46 slips over the resistor 27 in the well 31. The well 31 is circular in cross-section and closely receives the eyelet 45. The flange keeps the eyelet 45 from slipping completely into the well 31. The resistor 27 is soldered or otherwise electrically connected to a solder button 47. The eyelet 45 simply acts as a receiving substrate for the solder 47.

Referring to FIGS. 1 and 7, the well 29 is circular in cross-section and dimensioned to allow the cartridge assembly 19 to closely fit over the prod contact 15 within the cavity 5. The spring 26 comes into contact with the prod contact 15. The end cap 9 encloses the cavity 5 and the force of the spring 26 ensures that proper contact is maintained between the spring 26 and the prod contact 15 and between the end cap contact 13 and the solder button 47. The solder button 47 and the spring 26 act as cartridge assembly first and second contacts 47, 25, respectively.

If one of the test contacts 13, 15 has a spring mechanism, not shown, or the assembly 19 is closely matched to the dimension between the test contacts 13, 15 in order to maintain proper contact between the first contact 47 and the contact 13 and between the second contact 25 and the contact 15 then the second contact could be a button contact formed with an eyelet and solder button, not shown, in place of the spring 26 in a manner similar to the eyelet 45 and solder button 47.

In operation, the clamp 14 is attached to an acting ground, for example the negative terminal of an automotive battery or an exposed metallic portion of an automobile body, not shown.

The user grasps the handle 3 and touches a component to be tested. If the component has a positive polarity with respect to the wire 11 then current flows through LED 21 and it illuminates. For the preferred embodiment, LED 21 is red to indicate positive polarity. If the component is negative with respect to the wire 11 then LED 23 will conduct and will illuminate. For the preferred embodiment, LED 23 is green to indicate negative polarity. As will be evident to those skilled in the art LEDs of other colours could be used. Alternatively, the clamp can be attached to a first wire in a circuit, not shown, and the prod 7 touched to a second wire, not shown, in the circuit to determine the relative polarity of the two wires.

If it is desired to replace the assembly 19, for repair or replacement, the end cap 9 is simply removed and the cartridge is slipped out of the cavity 5. Another assembly 19 can easily be slipped into the cavity 5 and the end cap 9 is fit back into the cavity. The used assembly 19 itself can be discarded or defective components can be repaired if desired.

Figure 8:
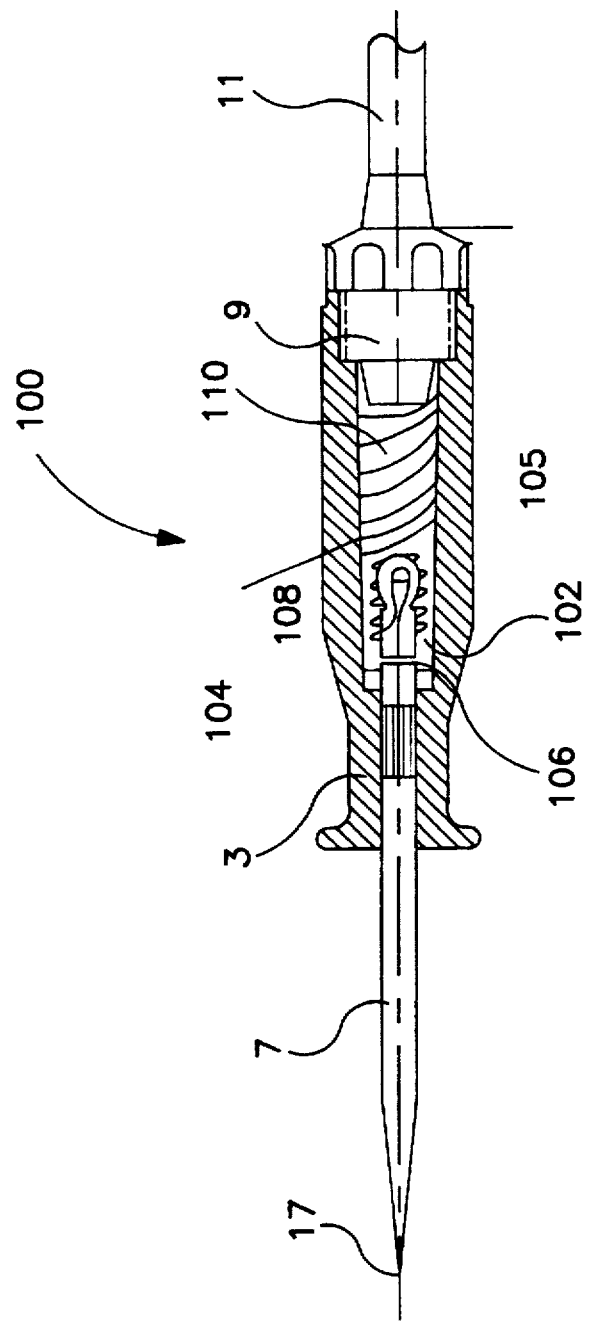
FIG. 8 is a cross-section of a prior art probe and bulb assembly.

Referring to FIG. 8, the assembly 19 may be retrofit into existing incandescent bulb probes 100. These probes 100 typically have a bulb assembly 102 with a bulb 103, bayonet mount 104 and a filament 105. The mount has an end contact 106 and side contacts 108. The end contact 106 is insulated from the side contacts 108. The side contacts 108 are connected to one end of the filament 105 while the end contact 106 is connected to the other end of the filament. A spring 110 fits over the bulb opposite the end contact 106 until the spring 110 meets the side contacts 108.

Other elements of the probe 100 are similar to the probe 1 and will not be re-described. Where the same reference numerals are used below in describing components of the probe 100, the components have the same functionality as the similarly numbered component for the probe 100.

The assembly 102 is very simple to use. The clamp 14 is attached to ground and the prod 7 is touched to a component to be tested, not shown. If there is sufficient voltage difference between the prod 7 and the wire 11 then the bulb 103 will illuminate. This simply indicates a voltage difference. It does not indicate the polarity of that difference.

In order to upgrade the probe 100 to a probe 1, the assembly 102 is simply removed and replaced by an assembly 19. The upgraded probe now has the ability to test for polarity.

The assembly 19 can also be use in other probes, not shown, that have an internal cavity and opposing test contacts.

Figure 9:
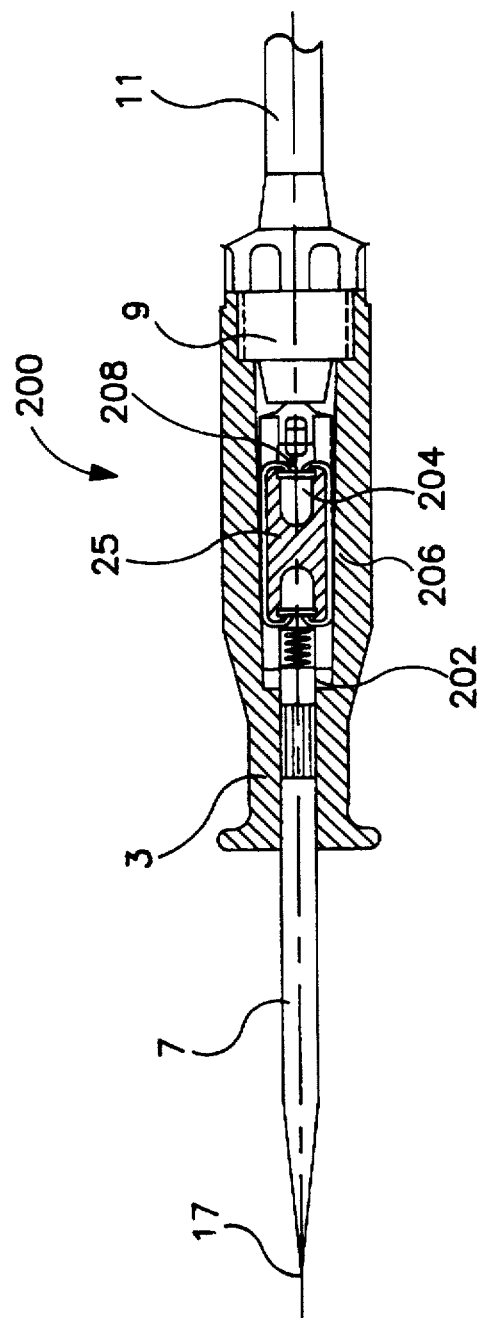
FIG. 9 is a cross-section of a probe according to an alternate preferred embodiment of the present invention.

Referring to FIG. 9, a probe 200 has an alternate cartridge assembly 202 with two LEDs in a single package 204. Each LED in the package 204 has a different colour. The package 204 replaces the LEDs 21, 23 and the anode and cathode of one of the LEDs within the package 204 are connected to the cathode and anode, respectively, of the other LED within the package 204. The connection of the anodes and cathodes together may be internal to the package 204 and first and second leads 206, 208 extend from the package 204 as is shown in the preferred embodiment. One lead 206 is connected to the spring 26 and the other lead 208 is connected to the resistor 45. Alternatively, a lead for each anode and cathode could extend from the package, not shown, and the connections between anodes and cathodes would be external to the package.

The package 204 fits in one of the wells 29, 31. FIG. 9 shows the package 204 in well 29. The anode 206 fits through the slot 33 and in the groove 41. The cathode 208 is trimmed and connected to the resistor 27.

It is to be noted that the probes 1, 100 and 200 of the preferred embodiment are identical except for the assemblies 19, 102, 202. This is a real advantage in manufacturing. An entire line of probes 1, 100, 200 can be produced by reusing much of the same tooling. Capital costs are reduced. Changing market conditions, both in consumer demand and availability of supply, can be more easily met by a manufacturer than with custom configurations for each different probe 1, 100, 200.

Another advantage to the assemblies 19 and 202 of the preferred embodiments is that they are not attached, by clips or otherwise, to the remainder of the probes 1, 200. The assemblies 19, 202 simply slip in and out of the cavity 5. This feature could be similarly achieved by having button contacts, not shown, on both ends of the assemblies 19, 202 rather than a spring 26 and solder button 47. In this case it would be advantageous to have a spring, or other resilient contact, on either the prod contact 15 or the end cap contact 13 in order to provide lateral pressure on each of the contacts 15, 13, 25, 47; however, if tolerances are sufficiently accurate this may not be necessary and simple button contacts could be used for each of the contacts 15, 13, 25, 47.

It will be understood by those skilled in the art that this description is made with reference to the preferred embodiment and that it is possible to make other embodiments employing the principles of the invention which fall within its spirit and scope as defined by the following claims.

I claim:

1. A testing probe comprising:
   a prod,
   a handle,
   an end cap,
   a wire,
   a cavity,
   first and second testing contacts, and
   an LED cartridge assembly,
   the prod extends from the handle, the end cap encloses the cavity within the handle and is removable from the handle to allow access to the cavity, at least a portion of the handle is translucent through to the cavity, the wire extends from the end cap outside of the handle, the first and second testing contacts are in the cavity and oppose one another, the first test contact is electrically connected to the prod, the second test contact is electrically connected to the wire, the LED cartridge assembly has a first LED with a first anode and a first cathode and a second LED with a second anode and a second cathode, each LED fits within a well in a holder, the first anode and second cathode are connected to a first assembly contact on a first end of the holder and the first cathode and second anode are connected to a second assembly contact on a second end of the holder opposing the first end, a portion of the holder is translucent to allow transmission of light from the first and second LED's through the holder, the holder being dimensioned to fit within the cavity of the probe with the first and second assembly contacts in contact with, but not attached to, the first and second testing contacts, the LED cartridge being able to be slipped into and out of the cavity when the end cap is removed from the handle.

2. An LED cartridge assembly for use in a cavity of a testing probe between first and second testing contacts, the testing probe having a prod, a handle, an end cap, and a wire, the prod extending from the handle, the end cap enclosing the cavity within the handle, the end cap being removable from the handle to allow access to the cavity, at least a portion of the handle being translucent through the cavity, the wire extending from the end cap outside of the handle, the first and second testing contacts being in the cavity and opposed to one another, the first test contact being electrically connected to the prod, the second test contact being electrically connected to the wire, the LED cartridge assembly comprising:
   a first LED with a first anode and a first cathode;
   a second LED with a second anode and a second cathode;
   each LED fitting within a well in a holder, the first anode and the second cathode being connected to a first assembly contact on a first end of the holder, and the first cathode and the second anode being connected to a second assembly on a second end of the holder opposing the first end, a portion of the holder being translucent to allow transmission of light from the first and second LED's through the holder, the holder being dimensioned to fit within the cavity of the probe with the first and second assembly contacts in contact with, but not attached to, the first and second testing contacts, and wherein the holder, the first and second LED's, and the first and second assembly contacts are dimensioned to be slipped into and out of the cavity when the end cap is removed from the handle.

3. The assembly according to claim 2, further comprising: a spring for the first assembly contact, and a button contact for the second assembly contact.

4. The assembly according to claim 2, wherein the holder comprises first and second wells, the first LED in the first well and the second LED in the second well.

5. The assembly according to claim 4, wherein the holder is generally cylindrical and has a longitudinal axis and opposing first and second holder ends along the longitudinal axis, the first well extends from the first holder end into the holder along the axis, the second well extends from the second holder end into the holder along the axis.

6. The assembly according to claim 5, wherein the respective anodes and cathode are connected to one another via leads extending from the first and second LEDs around either side of the holder.

7. The assembly according to claim 6, further comprising first and second slots, the first slot cut through the first well and the axis from the first end toward the first LED, the second slot cut through the second well and the axis from the second end toward the second LED, the leads passing through the first and second slots and around the sides of the holder.

8. The assembly of claim 7, wherein the holder further comprises first and second opposing grooves running longitudinally along either side of the holder, the leads fitting into the grooves.

9. The assembly of claim 8, wherein the second assembly contact is a button contact enclosing the second well at the second end of the holder.

10. The assembly of claim 9, wherein the first assembly contact is a spring extending along the axis in the first well.

11. The assembly of claim 10, further comprising a protection resistor connected between the second anode and the second assembly contact.

12. The assembly of claim 11, further comprising nonconductive electrical insulation between the spring and the first cathode.

13. The assembly of claim 12, further comprising nonconductive electrical insulation between the resistor and the second cathode.

14. The assembly of claim 13, further comprising a conductive eyelet pressure fit into the second well at the second end for receiving the second assembly contact.

15. The assembly of claim 2, wherein the first LED has a first colour and the second LED has a second colour visually distinguishable from the first colour.

16. The assembly of claim 2, wherein the first and second LEDs are in a single LED package in a single well in the holder.

17. An LED cartridge assembly for use in a cavity of a testing probe between first and second testing contacts, the testing probe having a prod, a handle, an end cap, and a wire, the prod extending from the handle, the end cap enclosing the cavity within the handle, the end cap being removable from the handle to allow access to the cavity, at least a portion of the handle is translucent through to the cavity, the wire extending from the end cap outside of the handle, the first and second testing contacts are in the cavity and oppose one another, the first test contact is electrically connected to the prod, the second test contact is electrically connected to the wire, the LED cartridge assembly comprising: a first LED with a first anode and a first cathode and a second LED with a second anode and a second cathode, each LED fits within a well in a holder, the first anode and second cathode are connected to a first assembly contact on a first end of the holder and the first cathode and second anode are connected to a second assembly contact on a second end of the holder opposing the first end, a portion of the holder is translucent to allow transmission of light from the first and second LED's through the holder, the holder is dimensioned to fit within the cavity of the probe with the first and second assembly contacts in contact with, but not attached to, the first and second assembly contacts in contact with, but not attached to, the first and second testing contacts, and the LED cartridge assembly is able to be slipped into and out of the cavity when the end cap is removed from the handle.

* * * * *